United States Patent [19]
Kaepp

[11] Patent Number: 5,799,293
[45] Date of Patent: Aug. 25, 1998

[54] METHOD FOR OPTIMIZING THE DESIGN OF A PRODUCT USING KNOWLEDGE-BASED ENGINEERING TECHNIQUES

[75] Inventor: Gregory A. Kaepp, Dearborn, Mich.

[73] Assignee: Ford Global Technologies, Inc., Dearborn, Mich.

[21] Appl. No.: 743,611

[22] Filed: Nov. 4, 1996

[51] Int. Cl.⁶ ............................................. G06F 15/18
[52] U.S. Cl. .............................................. 706/45; 706/61
[58] Field of Search .................... 395/75, 11, 54, 395/615, 51, 500, 77, 12, 10, 600, 50; 364/513, 479.01, 200, 300; 706/45, 52, 57, 61

[56] References Cited

U.S. PATENT DOCUMENTS

| | | | |
|---|---|---|---|
| 4,595,982 | 6/1986 | Burt | 364/300 |
| 4,648,044 | 3/1987 | Hardy et al. | 364/513 |
| 4,658,370 | 4/1987 | Erman et al. | 364/513 |
| 4,713,775 | 12/1987 | Scott et al. | 364/513 |
| 4,803,641 | 2/1989 | Hardy et al. | 364/513 |
| 4,829,426 | 5/1989 | Burt | 364/300 |
| 4,847,784 | 7/1989 | Clancey | 364/513 |
| 4,884,218 | 11/1989 | Agnew et al. | 364/513 |
| 4,922,432 | 5/1990 | Kobayashi et al. | 364/490 |
| 4,930,071 | 5/1990 | Tou et al. | 364/300 |
| 4,930,072 | 5/1990 | Agrawal et al. | 364/300 |
| 4,931,951 | 6/1990 | Murai et al. | 364/513 |
| 4,965,741 | 10/1990 | Winchell et al. | 364/513 |
| 5,016,170 | 5/1991 | Pollalis et al. | 364/401 |
| 5,164,897 | 11/1992 | Clark et al. | 364/401 |
| 5,197,016 | 3/1993 | Sugimoto et al. | 364/490 |
| 5,197,116 | 3/1993 | Katoh et al. | 395/51 |
| 5,228,116 | 7/1993 | Harris et al. | 395/54 |
| 5,302,132 | 4/1994 | Corder | 434/156 |
| 5,325,466 | 6/1994 | Kornacker | 395/77 |
| 5,333,237 | 7/1994 | Stefanopoulos et al. | 395/12 |
| 5,347,614 | 9/1994 | Yamada et al. | 395/75 |
| 5,388,188 | 2/1995 | Selfridge et al. | 395/50 |
| 5,414,798 | 5/1995 | Nigawara et al. | 395/75 |
| 5,418,889 | 5/1995 | Ito | 395/75 |
| 5,446,885 | 8/1995 | Moore et al. | 395/600 |
| 5,465,320 | 11/1995 | Enbutsu et al. | 395/22 |
| 5,490,232 | 2/1996 | Asano et al. | 395/10 |
| 5,504,840 | 4/1996 | Hiji et al. | 395/77 |
| 5,539,862 | 7/1996 | Short et al. | 395/50 |
| 5,555,406 | 9/1996 | Nozawa | 395/500 |
| 5,557,775 | 9/1996 | Shedletsky | 395/500 |

(List continued on next page.)

FOREIGN PATENT DOCUMENTS 0 508 308 A2  4/1992  European Pat. Off. ...... G05B 19/417

OTHER PUBLICATIONS

Howarth, N.;Douglas, S.; Graham, I.; and Winfield, M., Development of an integrated design and manufacture strategy using an expert system approach, Applications of artificial Intelligence in Engineering, Computational Machanics Publ. Southampton, Engl., 1994.

(List continued on next page.)

Primary Examiner—Allen R. MacDonald
Assistant Examiner—Pedro R. Kanof
Attorney, Agent, or Firm—David B. Kelley; Roger L. May

[57] ABSTRACT

A method for designing a product using a set of parameters and a set of instructions provided by a user is disclosed wherein the method includes the steps of receiving the set of parameters and the set of instructions to establish requirements of the product, determining a first calculation based on a calculated reason, performing the first calculation using the set of parameters and the set of instructions to achieve a first solution, communicating the first calculation to the user, communicating the calculated reason for performing the first calculation to the user, reviewing a set of second calculations, determining a preferred second calculation from the set of second calculations based on a second calculated reason, performing the preferred second calculation using the set of parameters and the set of instructions and the first solution, communicating the preferred second calculation to the user, and communicating the second calculated reason for performing the preferred second calculation to the user.

13 Claims, 4 Drawing Sheets

U.S. PATENT DOCUMENTS

| | | | |
|---|---|---|---|
| 5,644,686 | 7/1997 | Hekmatpour | 395/50 |
| 5,659,668 | 8/1997 | Misono et al. | 395/75 |
| 5,659,724 | 8/1997 | Borgida et al. | 395/603 |
| 5,673,369 | 9/1997 | Kim | 395/75 |

OTHER PUBLICATIONS von Hardenberg, Paul W.; Finn, Gavin A., Use of integrated Knowledge–based systems for helicopter design and manufacturing, Annual Forum Proceedings—American Helicopter Soc, Alexandria, VA, USA. v1, pp. 1–10, 1995.

Wierda, Leo S., Product Cost–Estimation by the Designer, Engineering Costs & Production Economics, v13, N3, pp. 189–198, Mar. 1988.

Division of Micro Control Systems, Vernon, CT announces the newest addition to the CADKEY Staron, Mary Beth, The CADKEY product line., CADkey, Vernon, CT, (203) 647–0220, Nov. 10, 1988.

Neipp, Gerhard, Computer–Integrated Mechanical Engineering (CIME), Robotics and Computer–Integrated Manufacturing, V7, No. 1/2, pp. 89–101, 1990.

Halliday, K.R., Computer aided design for manufacture, Proceedings of the IASTED Int'l. Symposium: Computer Aided Design and Applications, pp. 6–10, 1995.

Herbert Moskowitz and Gordon P. Wright,"Operations Research Techniques for Management", Prentice–Hall, Inc., Chapter 18: CPM and PERT Analysis (pp. 711–739), Jan. 1979.

Marek B. Zaremba and Biren Prasad, "Modern Manufacturing: Information Control and Technology", Springer–Verlag, Chapter 11: Integration of CAD, CAM and Process Planning, by Heiko Nordloh, Jan. 1994.

Chrysler Uses 3–D Design To Make A 90s Hot Rod, IBM Engineering Technology Solutions: Feature Story, in Web site: http://www.clearlake.ibm.com:80/MFG/engineering/news/feature.html, Apr. 8, 1997.

F.N. Hill, J.D. Ward and A.L. Yates, "SandKAST: An Automated Knowledge Acquisition System", Proceedings of the American Association for Artificial Intelligence, Jul. 13, 1987, pp. 1–13.

Brodie et al., ed., "On Knowledge Base Management Systems: Integrating artificial Intelligence & Database Technologies", Chapter 28: The Role of Database in Knowledge–Based Systems, by Mark S. Fox and John McDermott, Springer–Verlag, pp. 407–430, Jan. 1986.

Gwo–Jen Hwang, "Knowledge Acquisition and Validation for Implicit Expertise", Proceedings of the 4th International Conference on Software Engineering, IEEE, pp. 32–39, Jan. 1992.

Selmin Nurcan and Jacques Kouloumdjian, "An Advanced Knowledge Base Management System based on the integration of Logic programming and relational database", Proceedings of the 5th Annual European Compuer Conference, May 13–16, 1991, pp. 740–744.

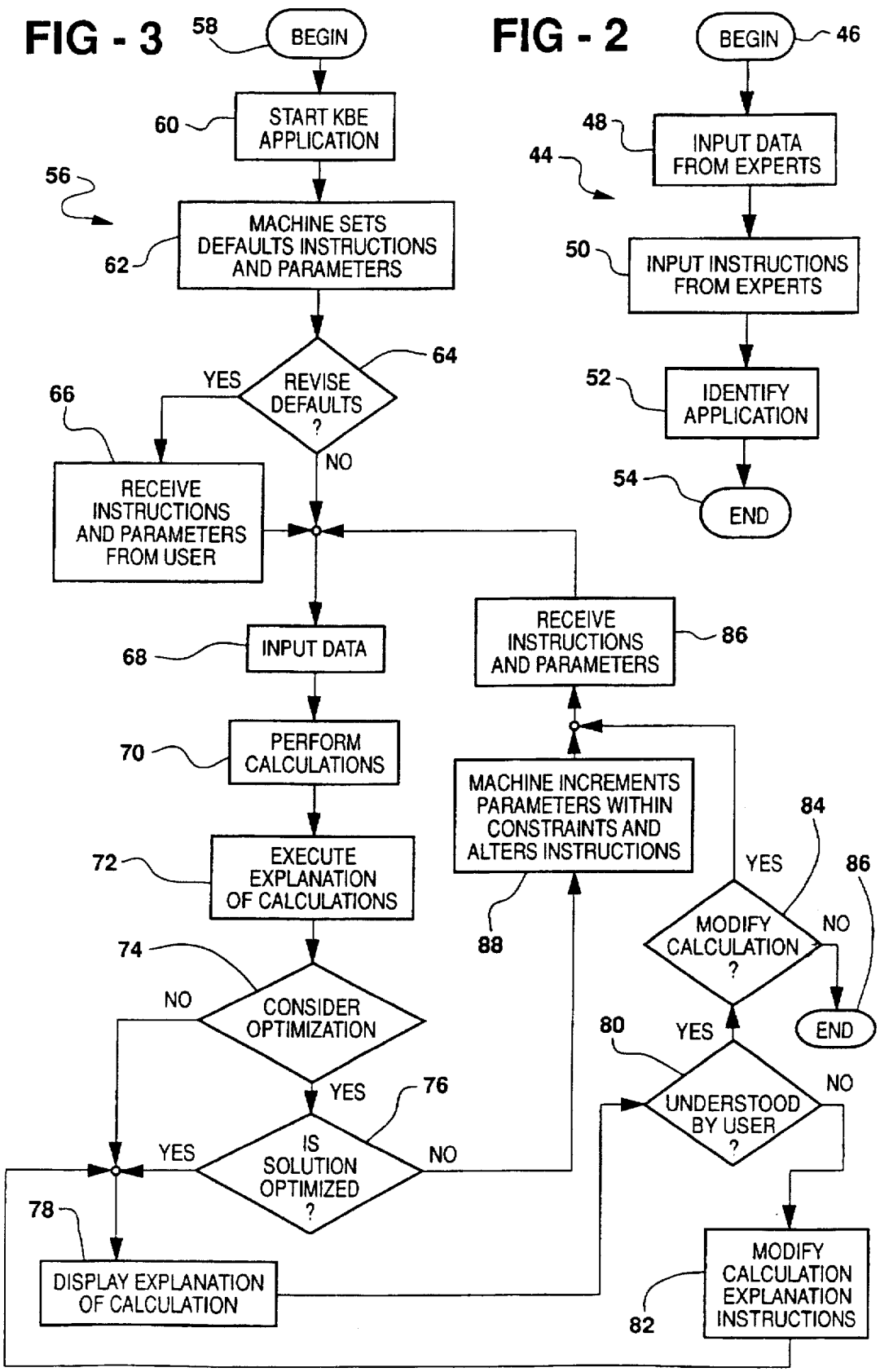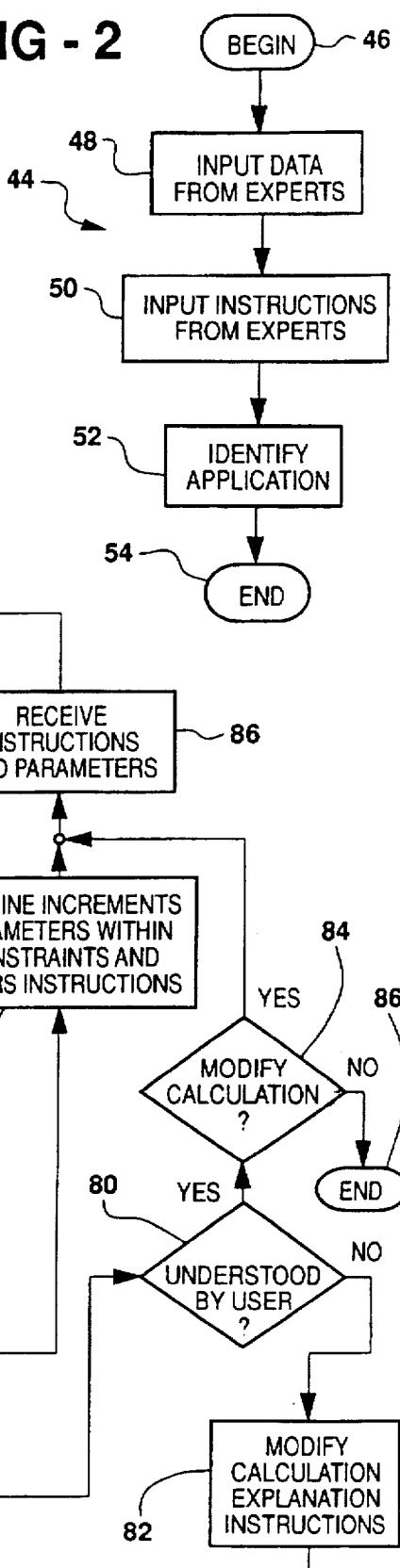

METHOD FOR OPTIMIZING THE DESIGN OF A PRODUCT USING KNOWLEDGE-BASED ENGINEERING TECHNIQUES

BACKGROUND OF THE INVENTION

1. Field of the Invention

The present invention relates to a method for designing a product, and more particularly, to designing a product using a knowledge-based system capable of optimizing its solution.

2. Description of the Related Art

Systems that are knowledge-based are being incorporated into many design situations in order to maximize the amount of knowledge used during the situations. Databases of knowledge are collected to be used subsequently as deemed pertinent. One such knowledge-based system is disclosed in U.S. Pat. No. 5,388,188, issued to Selfridge, et al. The knowledge-based system provides advice to the user of the system based on the environment of the design application used. The user then decides which advice is to be utilized and incorporates it into the process for an ultimate solution.

A major disadvantage associated with systems such as that disclosed in U.S. Pat. No. 5,388,188 is the ultimate reliance on the user to make the decision as to the path which should be taken. When a knowledge-based system provides options at any given level, it is up to the user to decide which option is to be taken. The user makes the decision without the knowledge of subsequent potential steps which may have resulted in a more optimal solution. This occurs even though a preliminary step may not have seemed optimal but for knowing the steps or options available if that option had been taken. Therefore, there is a need in the art for a knowledge-based system which is capable of deciding which option is most optimal when viewed in the context of the problem and the solution.

SUMMARY OF THE INVENTION

Accordingly, a method for designing a product using a set of parameters and a set of instructions provided by a user is disclosed. The method includes the step of receiving the set of parameters and the set of instructions to establish requirements of the product. A first calculation is determined based on a calculated reason. The first calculation is performed using the set of parameters and the set of instructions to achieve a first solution. The first calculation is communicated to the user. The calculated reason for performing the first calculation is also communicated to the user. A second set of calculations is then reviewed. A preferred second calculation from a set of second calculations based on a second calculated reason is determined. The preferred second calculation is communicated to the user and the second calculated reason for performing the second preferred calculation is communicated to the user.

One advantage associated with the present invention is the ability to design a product. Another advantage associated with the present invention is the ability to design a product in an optimal fashion with respect to knowledge of both the problem and the resulting solution. Yet another advantage associated with the present invention is the ability to communicate the reasons why particular calculations have been made. Still another advantage associated with the present invention is the ability to train the user of the system while generating a solution to a design problem.

Other features and advantages of the present invention will be readily appreciated as the same becomes better understood after reading the subsequent description taken in conjunction with the accompanying drawings.

BRIEF DESCRIPTION OF THE DRAWINGS

FIG. 2 is a flowchart representing the creation of the knowledge-based system utilized by the method of the present invention.

FIG. 3 is a flowchart representing one embodiment of the method of the present invention.

DESCRIPTION OF THE PREFERRED EMBODIMENT(S)

Figure 1:
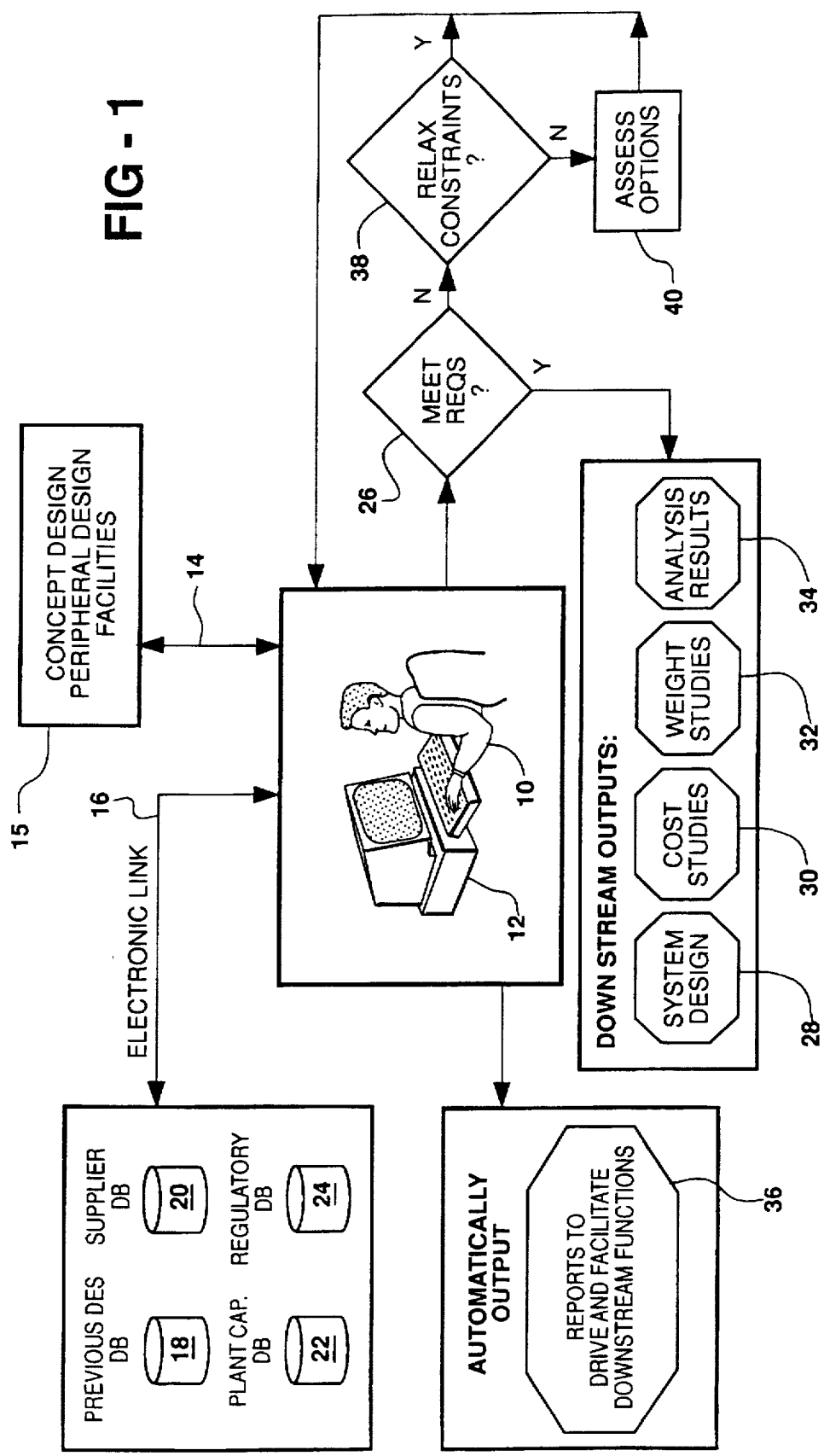
FIG. 1 is a block diagram of one embodiment of an architecture which may be utilized with the method according to the present invention.

Referring to FIG. 1, a user 10 utilizes a machine 12 to design a product. The user 10 inputs a set of parameters and a set of instructions into the machine 12 when prompted to do so thereby. The set of parameters and the set of instructions may be product specific wherein other data and instruction non-specific to the product may already be stored in the machine 12.

The machine 12 is connected via an electronic link 14 to facilities 15 used to design components and products not directly related to the product being designed, but may relate to the product in some way. By way of example, the design of a bumper may be dependent upon the design of the frame by which the bumper is supported. Therefore, the information regarding the frame should be used when developing the design of the product, i.e., the bumper.

The machine 12 is also connected via an electronic link 16 to several databases 18, 20, 22, 24. The databases shown in FIG. 1 include a previous design database 18, supplier database 20, plant capacity database 22 and regulatory database 24. The databases 18, 20, 22, 24 are shown by way of example and are not to be considered in any way limiting.

Once the machine 12 receives the set of parameters and instructions from the user 10, and any information regarding related products or information from the databases 18, 20, 22, 24, the machine 12 utilizes a method, discussed in detail subsequently, to determine whether requirements have been met. This test is graphically represented at 26 in FIG. 1. If so, the solution for the design of the product is sent to be used in system designs 28, cost studies 30, weight studies 32, and analysis results 34. These are four enumerated downstream outputs. Other output connections may be used where the information regarding the design of the product may be required. Also, an automatic output 36 generates reports which can be used to facilitate the downstream functions 28, 30, 32, 34.

If the requirements are not met, it is then determined whether the requirements or constraints should be relaxed at 38. If so, this decision is affirmed by the user 10 via the machine 12. If not, options are assessed at 40 by the user 10 to determine which avenue to take when developing a final design for the product. If it is determined that the machine 12 is capable of performing the design task exclusively, the user 10 may allow the machine 12 to complete the design task without requiring the machine 12 to interrogate interrupts for input by the user 10. The user 10 is, however, always capable of directing the machine 12 to interrogate the interrupts. In addition, the machine 12 may perform the design task with intervention by the user 10 only to play back the steps taken during the design task to the user 10 at a later time for training.

Referring to FIG. 2, a flowchart is generally indicated at 44. The flowchart 44 represents a method used to generate a knowledge-based system to be used by the user 10 via the machine 12 to design the product. The method begins at 46. Data from experts is input at 48. This data may be received from the databases 18, 20, 22, 24 or they may be obtained via the electronic link 14 from various related departments. Once the data has been input, instructions on how to operate and utilize the data are input at 50. These instructions may also come from databases 18, 20, 22, 24 as well as the peripheral design facilities 15. Once the data and instructions have been input, an application for the data and the instructions is identified at 52. The identified application is the designing of the product using the data and instructions and subsequent inputs by the user 10. Once the application has been identified, the method is terminated at 54.

Referring to FIG. 3, a flowchart of one embodiment of the method of the invention is generally indicated at 56. The method begins at 58. The knowledge-based engineering (KBE) application is started at 60. The machine 12 receives the set of default instructions and parameters at 62. It is then determined whether the default instructions and parameters need to be revised at 64. If so, the user 10 provides instructions and parameters to be utilized by the KBE application at 66. Data is input at 68 regardless of whether the default instructions and parameters need to be revised or not. Calculations are performed at 70. More specifically, it is determined what a first calculation should be. This first calculation is based on a first calculated reason as to why the first calculation should be made. The first calculation is performed using the parameters and instructions provided to achieve a first solution. Reasons and explanations of the first calculations are provided at 72 via multiple mediums of communication commonly referred to as multimedia. The first calculation is then communicated to the user 10. The first calculated reason for performing the first calculation is also communicated to the user 10 at this point. It is then determined whether optimization should be considered at 74. If so, a test of optimization with regard to the solution, the first solution or any subsequent solution, is performed at 76. If so, the explanation to the calculations are displayed at 78. If optimization, considered at 74, is not performed, the explanation is also displayed at 78. All communications are performed via multimedia, i.e., text, sound, video excerpts and the like.

The step of calculations is iterative. More specifically, once the first calculation has been made, the machine 12 determines a preferred second calculation from a set of second calculations based on a second calculated reason for performing the preferred second calculation. Once the preferred second calculation is determined, it is performed using the set of parameters and instructions and the results from the first solution. The preferred second calculation is communicated to the user 10 through the display explanation at 78. The second calculated reason is also displayed to the user 10. Likewise, the second solution is also displayed so that the user 10 may understand the logical steps to the end result, namely the design of the product, based on the parameters and instructions given to the machine 12.

After the second calculations have been made, a plurality of preferred subsequent calculations are made, all of which are communicated to the user 10 after each is made, similar to the manner in which the first calculation and second calculation are communicated. All of the preferred subsequent calculations are determined by selecting them from a plurality of sets of potential sets of calculations, discussed subsequently.

A test is performed once the explanations and calculations have been displayed. The test is whether the user 10 understands the communicated explanations and calculations at 80. If not, the explanations for the calculations are modified, at 82, and redisplayed at 78. If they are understood by the user 10, it is determined whether the calculations should be modified at 84. If not, the method as shown in the flowchart 56 is terminated at 86. If so, additional instructions and parameters are received at 86 whereafter data is input at 68.

If the solution is not optimized, a test is performed at 76 wherein the machine 12 increments the parameters within the constraints and alters the instructions at 88 to ensure optimization of the design of the product at a subsequent iteration.

Figure 4:
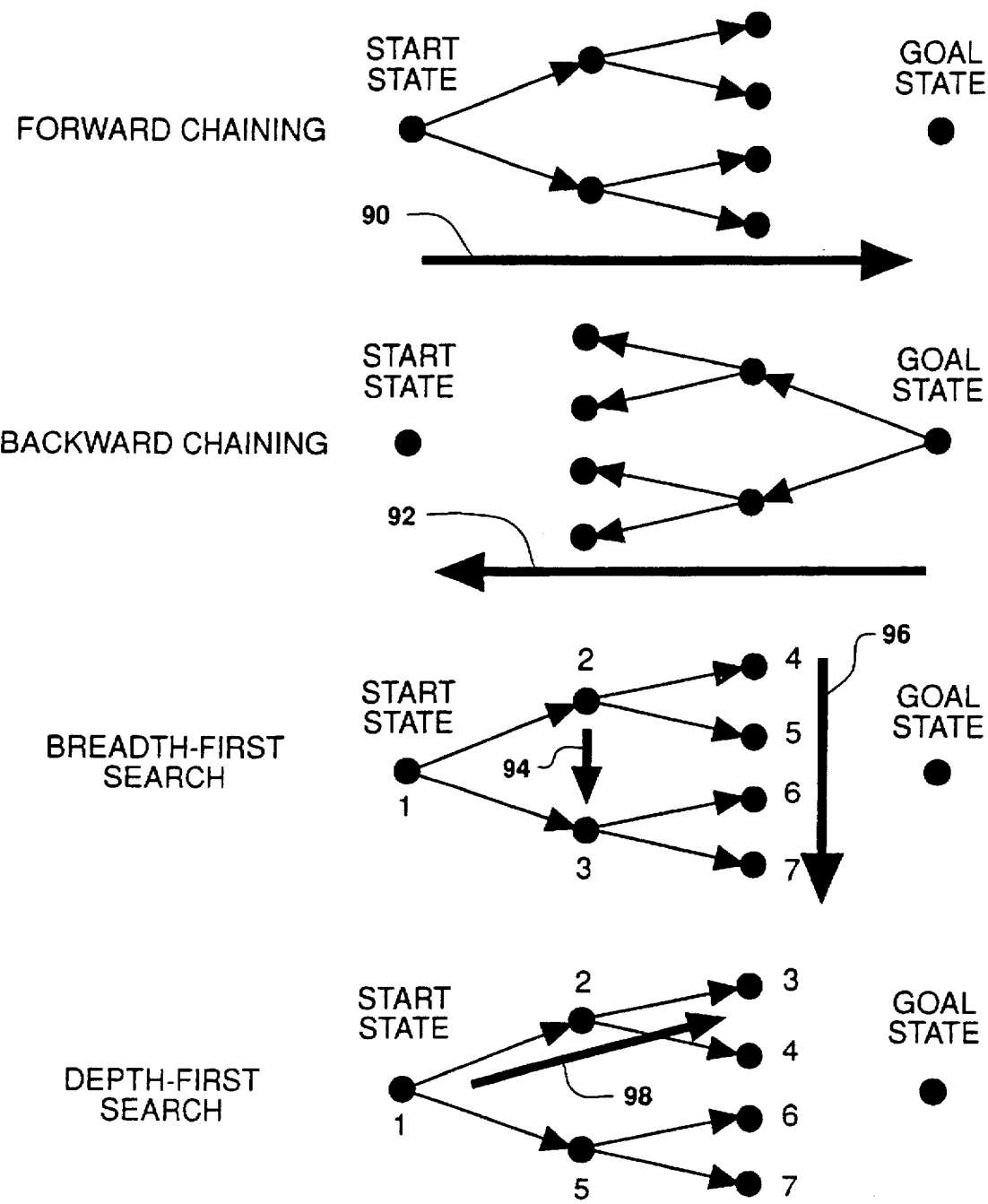
FIG. 4 is a graphic representation of four search orders which may be utilized by the method of the present invention.

Referring to FIG. 4, four types of search orders are shown executed by the method as shown in the flowchart 56. It may be appreciated that most KBE systems may incorporate the forward chain search shown at the top of FIG. 4. This is the only type of search capable of those systems because user intervention must be made at every step of the solution process. The method of the present invention, however, is capable of utilizing several different types of search orders. In one embodiment, the method of the present invention utilizes the four search orders in FIG. 4, namely the forward chaining, backward chaining, breadth-first search, and depth-first searching capabilities. In the breadth-first searching and depth-first searching, the method steps through the enumerated positions or functions in progressive order, one through seven, in each example. The arrows 90, 92, 94, 96, 98 all represent the direction in which the method as shown in the flowchart 56 moves to optimize the solution to the design of the product.

Figure 5:
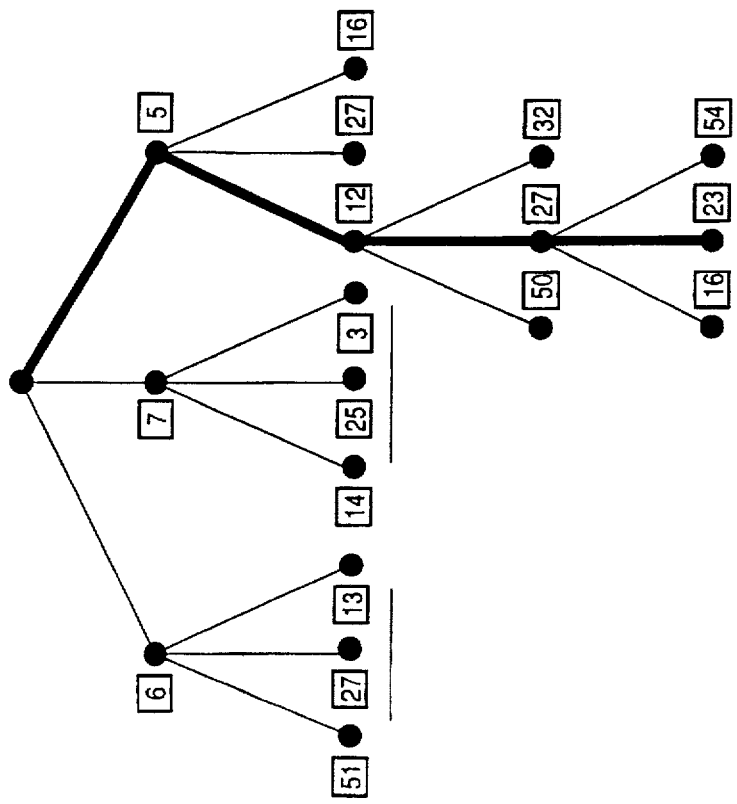
FIG. 5 is a tree diagram representing a decision making process of the user utilizing a knowledge-based system of the prior art.

Referring to FIG. 5, an example of how a knowledge-based engineering system of the prior art operates is shown. The numerals within the rectangles next to each circle denoting a decision point identifies the costs associated with each decision. In the first step, the user selects between three steps with the costs associated with each step being six, seven and five, respectively. At this point, the user 10 selects the optimal solution without knowledge of the second set or tier of calculations which may be made depending upon the decision made in the first tier or set of calculations. In this example, the user 10 selects the decision having a cost of five associated therewith. This is done because this cost is the least expensive at this point. However, the user 10 selected this decision based only upon the comparison of the three opportunities and not any subsequent opportunities presented by the decisions with costs six and seven associated therewith. This is a short-sighted process because future costs or opportunities are not utilized. The machine 12 then gives three more decisions to the user to select, the costs of which are twelve, twenty-seven and sixteen, respectively. The user selects the decision with the cost of twelve associated therewith. This cost, although the least expensive in the available decisions, is far more expensive than the cost of three decision which is a direct result of choosing the decision having a cost of seven in the first tier. However, the user 10 does not know that this decision is available. The total cost in this example after four levels of decisions is sixty-seven.

Figure 6:
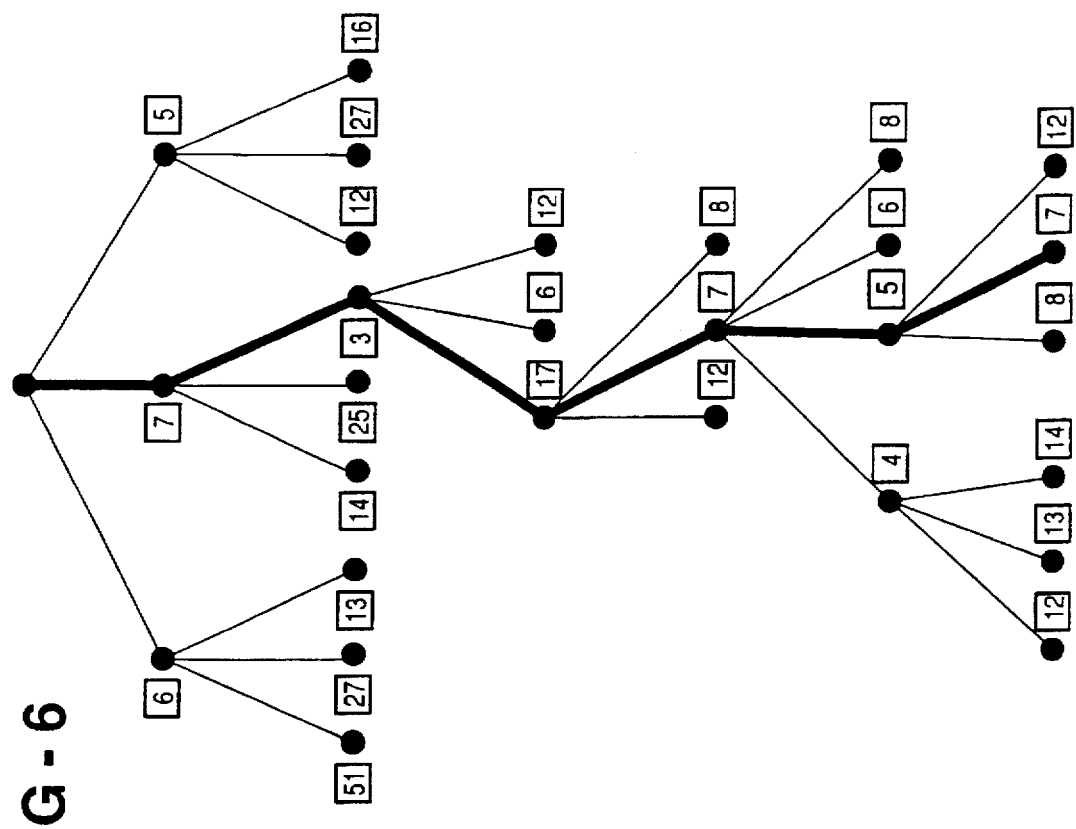
FIG. 6 is a tree diagram representing a decision making process according to one embodiment of the method of the present invention.

Referring to FIG. 6, a similar decision tree with a decision path generated by the method of the present invention is shown. Here, the decisions made extend through six levels with a cost associated therewith of forty-six. In this example, the machine 12 was able to identify opportunities to make decisions in the total decision tree in order to determine which decisions would eventually result in an ultimate decision having the lowest cost. By using the four search orders shown in FIG. 4, the method as shown in the flowchart 56 is able to identify the optimal solution when designing a product.

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method for designing a product using a set of parameters and a set of instructions provided by a user, the method comprising the steps of:

receiving the set of parameters and the set of instructions to establish requirements of the product;

determining a first calculation based on a calculated reason;

performing the first calculation using the set of parameters and the set of instructions to achieve a first solution;

communicating the first calculation to the user;

communicating the calculated reason for performing the first calculation to the user;

reviewing a set of second calculations;

determining a preferred second calculation from the set of second calculations based on a second calculated reason;

performing the preferred second calculation using the set of parameters, the set of instructions and the first solution;

communicating the preferred second calculation to the user;

communicating the second calculation reason for performing the preferred second calculation to the user; and testing whether the user understands the communicated reasons and calculations.

2. A method as set forth in claim 1 including the step of performing a plurality of preferred subsequent calculations after the step of communicating the second calculated reason.

3. A method as set forth in claim 2 including the step of communicating a separate calculated reason after each of the plurality of preferred subsequent calculations.

4. A method as set forth in claim 2 including the step of determining each of the plurality of preferred subsequent calculations from a plurality of sets of potential calculations.

5. A method as set forth in claim 1 wherein the step of communicating the calculated reason includes the use of multiple mediums of communication.

6. A method as set forth in claim 1 wherein the step of communicating the second calculated reason includes the use of multiple mediums of communication.

7. A method as set forth in claim 2 wherein the first calculation, the second calculation and the plurality of preferred subsequent calculations are used to generate a solution.

8. A method as set forth in claim 7 including the step of optimizing the solution.

9. A method as set forth in claim 8 wherein the step of optimizing the solution includes the step of modifying the set of parameters.

10. A method as set forth in claim 8 wherein the step of optimizing the solution includes the step of modifying the set of instructions.

11. A method for designing a product using a set of parameters and a set of instructions provided by a user, the method comprising the steps of:

receiving the set of parameters and the set of instructions to establish requirements of the product;

determining a first calculation based on a calculated reason;

performing the first calculation using the set of parameters and the set of instructions to achieve a first solution;

communicating the first calculation to the user;

communicating the calculated reason for performing the first calculation to the user;

reviewing a set of second calculations;

determining a preferred second calculation from the set of second calculations based on a second calculated reason;

performing the preferred second calculation using the set of parameters, the set of instructions and the first solution;

communicating the preferred second calculation to the user;

communicating the second calculation reason for performing the preferred second calculation to the user;

performing a plurality of preferred subsequent calculations after the step of communicating the second calculated reason;

communicating a separate calculated reason after each of the plurality of preferred subsequent calculations;

testing whether the user understands the communicated reasons and calculations; and modifying the reasons for the calculations and communicating them to the user if not understood by the user.

12. A method for designing a product using a set of parameters and a set of instructions provided by a user, the method comprising the steps of:

receiving the set of parameters and the set of instructions to establish requirements of the product;

determining a first calculation based on a calculated reason;

performing the first calculation using the set of parameters and the set of instructions to achieve a first solution;

communicating the first calculation to the user;

communicating the calculated reason for performing the first calculation to the user;

reviewing a set of second calculations;

determining a preferred second calculation from the set of second calculations based on a second calculated reason;

performing the preferred second calculation using the set of parameters, the set of instructions and the first solution;

communicating the preferred second calculation to the user;

communicating the second calculation reason for performing the preferred second calculation to the user;

performing a plurality of preferred subsequent calculations after the step of communicating the second calculated reason;

communicating a separate calculated reason after each of the plurality of preferred subsequent calculations;

determining each of the plurality of preferred subsequent calculations from a plurality of sets of potential calculations; and testing whether the user understands the communicated reasons and calculations.

13. A method for designing a product using a set of parameters and a set of instructions provided by a user, the method comprising the steps of:

receiving the set of parameters and the set of instructions to establish requirements of the product;

determining a first calculation based on a calculated reason;

performing the first calculation using the set of parameters and the set of instructions to achieve a first solution;

communicating the first calculation to the user;

communicating the calculated reason for performing the first calculation to the user;

reviewing a set of second calculations;

determining a preferred second calculation from the set of second calculations based on a second calculated reason;

performing the preferred second calculation using the set of parameters, the set of instructions and the first solution;

communicating the preferred second calculation to the user;

communicating the second calculation reason for performing the preferred second calculation to the user;

performing a plurality of preferred subsequent calculations after the step of communicating the second calculated reason;

communicating a separate calculated reason after each of the plurality of preferred subsequent calculations;

testing whether the user understands the communicated reasons and calculations; and modifying the reasons for the calculations and communicating them to the user if not understood by the user.

* * * * *